(12) United States Patent
Zhang et al.

(10) Patent No.: US 11,658,232 B2
(45) Date of Patent: May 23, 2023

(54) FIELD EFFECT TRANSISTOR BASED ON GRAPHENE NANORIBBON AND METHOD FOR MAKING THE SAME

(71) Applicants: Tsinghua University, Beijing (CN); HON HAI PRECISION INDUSTRY CO., LTD., New Taipei (TW)

(72) Inventors: Tian-Fu Zhang, Beijing (CN); Li-Hui Zhang, Beijing (CN); Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

(*) Notice: Subject to any disclaimer, the term of this patent is extended or adjusted under 35 U.S.C. 154(b) by 84 days.

(21) Appl. No.: 17/206,786

(22) Filed: Mar. 19, 2021

(65) Prior Publication Data
US 2022/0181475 A1     Jun. 9, 2022

(30) Foreign Application Priority Data
Dec. 9, 2020 (CN) .......................... 202011447903.6

(51) Int. Cl.
*H01L 29/76* (2006.01)
*H01L 29/06* (2006.01)
(Continued)

(52) U.S. Cl.
CPC .... *H01L 29/7606* (2013.01); *H01L 21/02527* (2013.01); *H01L 21/02603* (2013.01);
(Continued)

(58) Field of Classification Search
None
See application file for complete search history.

(56) References Cited

U.S. PATENT DOCUMENTS

2011/0147697 A1* 6/2011 Shah .................... H01L 29/775
                                                                977/762
2013/0266729 A1   10/2013 Lin et al.
(Continued)

FOREIGN PATENT DOCUMENTS

| TW | 201341309 | 10/2013 |
|----|-----------|---------|
| TW | 201442250 | 11/2014 |

OTHER PUBLICATIONS

Qin X, WO-2018076268-A1, May 2018 (Year: 2018).*

*Primary Examiner* — Nilufa Rahim
(74) *Attorney, Agent, or Firm* — ScienBiziP, P.C.

(57) ABSTRACT

A method for making a field effect transistor includes providing a graphene nanoribbon composite structure. The graphene nanoribbon composite structure includes a substrate and a plurality of graphene nanoribbons spaced apart from each other. The plurality of graphene nanoribbons are located on the substrate and extend substantially along a same direction, and each of the plurality of graphene nanoribbons includes a first end and a second end opposite to the first end. A source electrode is formed on the first end, and a drain electrode is formed on the second end. The source electrode and the drain electrode are electrically connected to the plurality of graphene nanoribbons. An insulating layer is formed on the plurality of graphene nanoribbons, and the plurality of graphene nanoribbons are between the insulating layer and the substrate. A gate is formed on a surface of the insulating layer away from the substrate.

12 Claims, 16 Drawing Sheets

(51) Int. Cl.
*H01L 29/16* (2006.01)
*H01L 29/417* (2006.01)
*H01L 29/423* (2006.01)
*H01L 29/786* (2006.01)
*H01L 29/66* (2006.01)
*H01L 21/02* (2006.01)
*H01L 21/78* (2006.01)
*H01L 21/04* (2006.01)

(52) U.S. Cl.
CPC .......... *H01L 21/042* (2013.01); *H01L 21/043* (2013.01); *H01L 21/044* (2013.01); *H01L 21/7806* (2013.01); *H01L 29/0673* (2013.01); *H01L 29/1606* (2013.01); *H01L 29/41733* (2013.01); *H01L 29/42384* (2013.01); *H01L 29/66045* (2013.01); *H01L 29/78696* (2013.01)

(56) References Cited

U.S. PATENT DOCUMENTS

| | | |
|---|---|---|
| 2016/0035903 A1 | 2/2016 | Okachi et al. |
| 2017/0054033 A1* | 2/2017 | Lee .................. H01L 29/78681 |
| 2019/0165120 A1* | 5/2019 | Sato .................. H01L 21/28026 |
| 2021/0125836 A1* | 4/2021 | Huang ................ H01L 21/0337 |
| 2021/0126122 A1* | 4/2021 | Ando .................... H01L 29/517 |
| 2021/0210643 A1* | 7/2021 | Shimatani ......... H01L 27/14616 |
| 2022/0037480 A1* | 2/2022 | Hu ....................... H01L 29/165 |

* cited by examiner

FIELD EFFECT TRANSISTOR BASED ON GRAPHENE NANORIBBON AND METHOD FOR MAKING THE SAME

CROSS-REFERENCE TO RELATED APPLICATIONS

This application is related to commonly-assigned application entitled, "GRAPHENE NANORIBBON COMPOSITE STRUCTURE AND METHOD FOR MAKING THE SAME", concurrently filed; "FIELD EFFECT TRANSISTOR AND METHOD FOR MAKING THE SAME", concurrently filed. The entire contents of which are incorporated herein by reference.

FIELD

The present application relates to a field effect transistor and a method for making the field effect transistor.

BACKGROUND

The field effect transistor (abbreviated as FET) has two main types: junction FET-JFET and metal-oxide semiconductor FET (abbreviated as MOS-FET). The field effect transistor is a voltage-controlled semiconductor device. The field effect transistor has the advantages of high input resistance, low noise, and low power, and has become a strong competitor of bipolar transistors and power transistors.

The material for forming the semiconductor layer of the field effect transistor is amorphous silicon or polysilicon. The preparation technology of amorphous silicon field effect transistor using amorphous silicon as the semiconductor layer is relatively mature. However, in the amorphous silicon field effect transistor, the semiconductor layer usually contains a large number of dangling bonds, resulting in low carrier mobility and a slower response speed of the field effect transistor. The field effect transistor using polysilicon as the semiconductor layer has a higher carrier mobility than the field effect transistor using amorphous silicon as the semiconductor layer, so the response speed is also faster. However, the low-temperature production cost of the polysilicon field effect transistor is relatively high, the method for making the polysilicon field effect transistor is more complicated, and large-area production of the polysilicon field effect transistor is difficult.

Therefore, there is room for improvement in the art.

BRIEF DESCRIPTION OF THE DRAWINGS

Implementations of the present technology will now be described, by way of embodiments, with reference to the attached figures, wherein.

DETAILED DESCRIPTION

Figure 1:
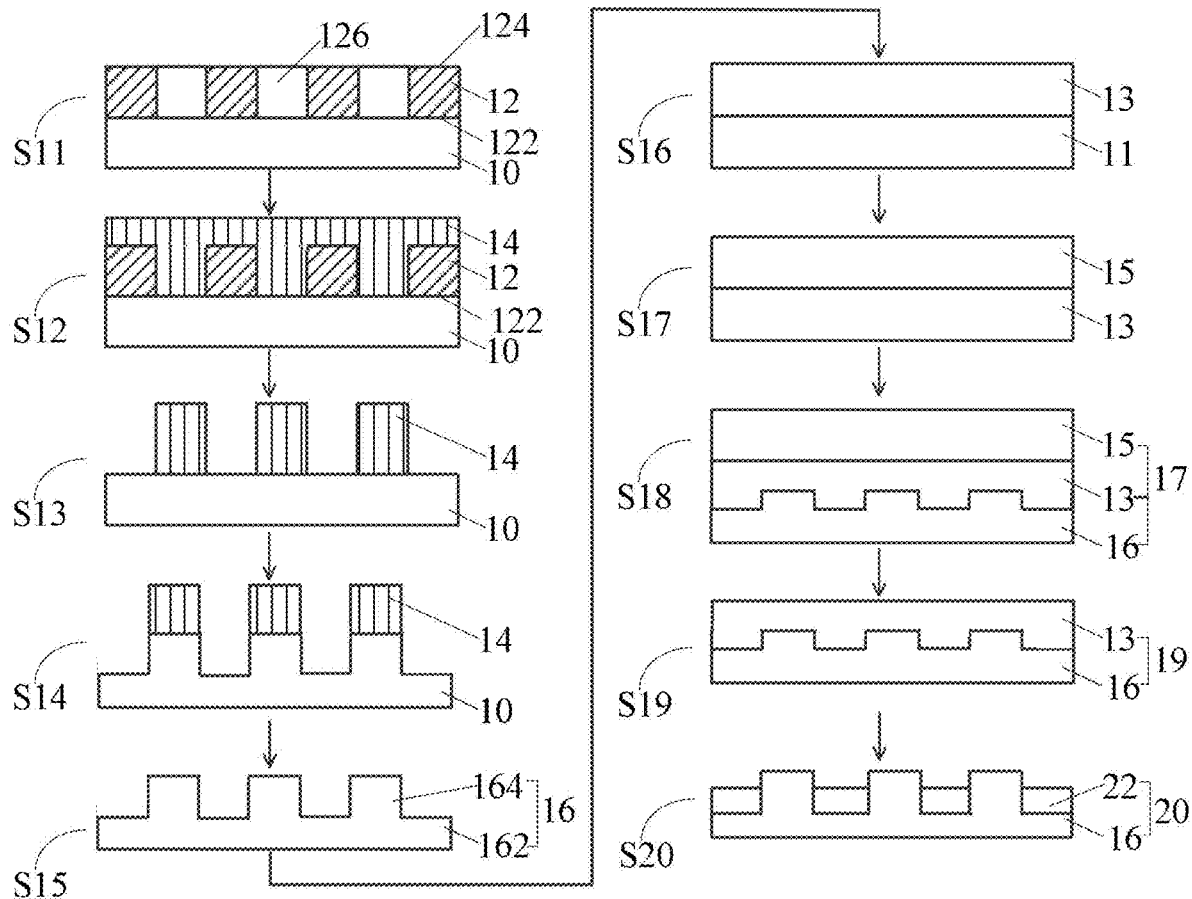
FIG. 1 shows a schematic process flow of a method for making a graphene nanoribbon composite structure in a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

An infrared absorber of a first embodiment is a carbon nanotube structure formed by stacking a plurality of drawn carbon nanotube films.

Figure 2:
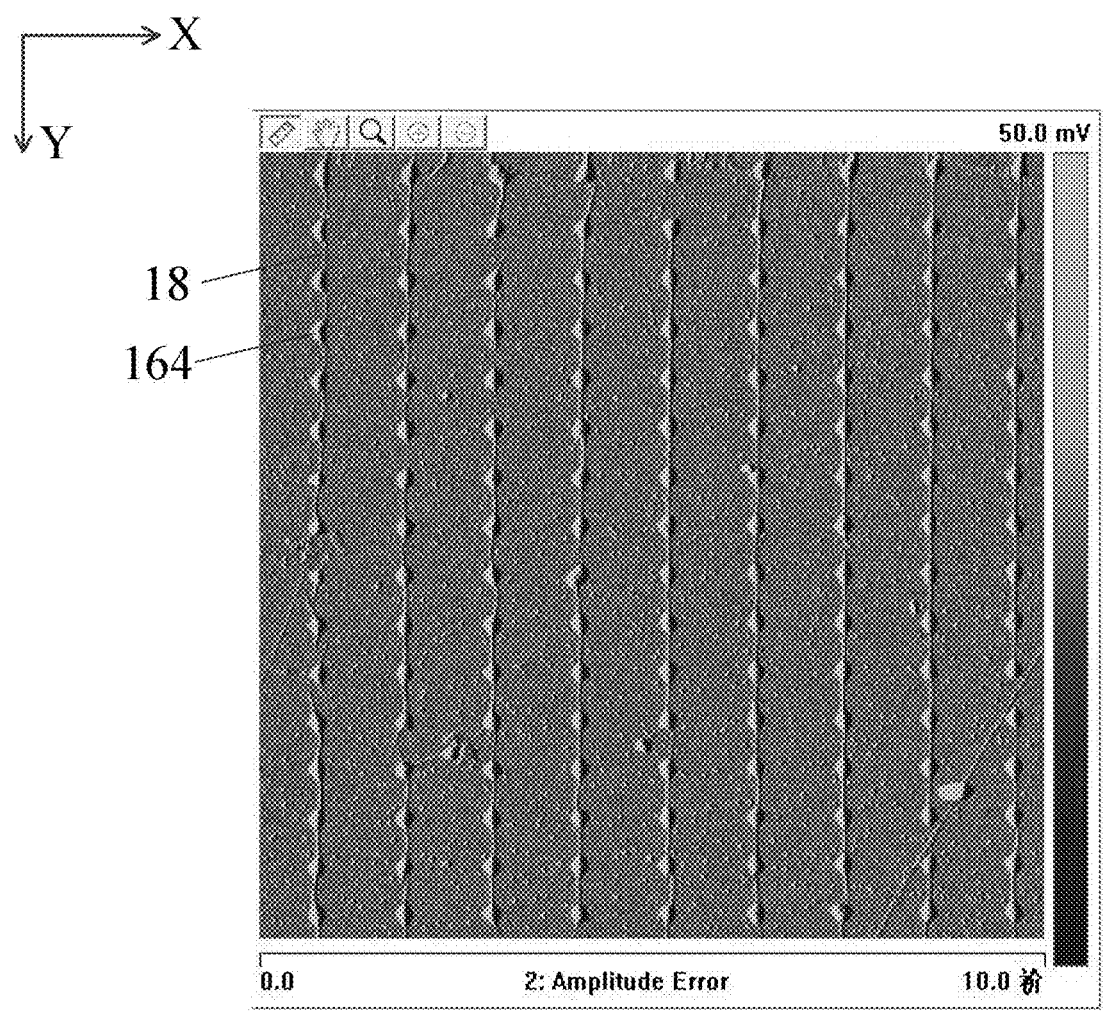
FIG. 2 shows an atomic force microscope (AFM) image of a second composite structure in the first embodiment.
Figure 5:
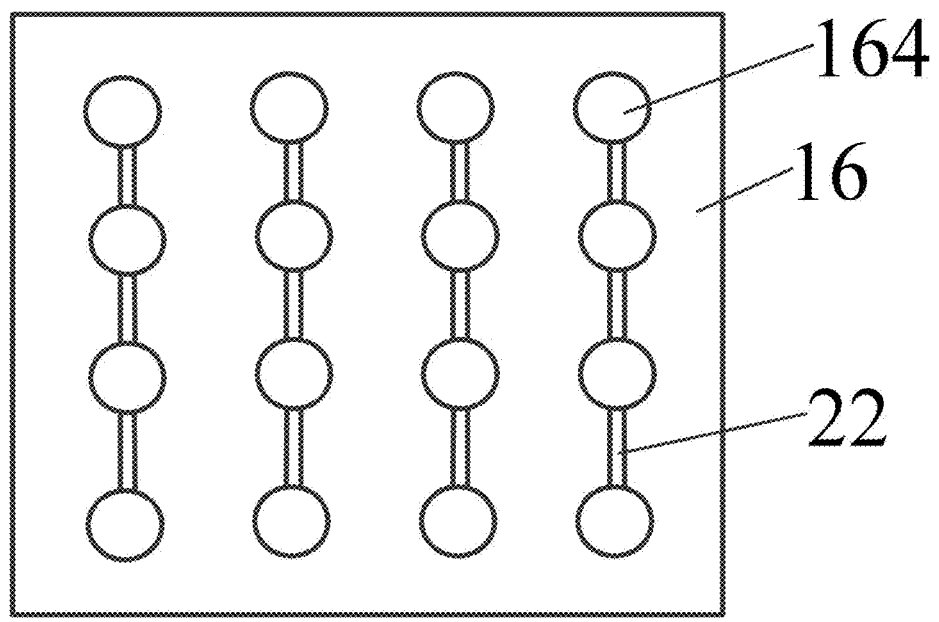
FIG. 5 shows a schematic top view of the graphene nanoribbon composite structure of FIG. 1.

Referring to FIG. 1, FIG. 2, and FIG. 5, a method for making a graphene nanoribbon composite structure 20 of a first embodiment, includes one or more of the following steps:

S11, locating a mask layer 12 on a base 10, wherein the mask layer 12 has a first surface 122 and a second surface 124 opposite to the first surface 122, the first surface 122 is in direct contact with the base 10, the mask layer 12 defines a plurality of through holes 126 spaced apart from each other, the through holes 126 extend from the first surface 122 to the second surface 124, an X direction and a Y direction are defined on the surface of the base 10, and the X direction and the Y direction are perpendicular to each other;

S12, locating a metal layer 14 on the second surface 124, wherein the through holes 126 are filled with the metal layer 14;

S13, peeling off the mask layer 12, wherein the metal layer 14 on the second surface 124 is also removed while peeling off the mask layer 12, and the metal layers 14 in the through holes 126 remain on the base 10;

S14, using the metal layer 14 remaining on the base 10 as a mask, and etching the base 10;

S15, removing the metal layer 14 remaining on the base 10 to obtain a structure 16, wherein the structure 16 comprises a substrate body 162 and a plurality of protrusions 164 spaced apart from each other, the protrusions 164 are located on the surface of the substrate body 162;

S16, growing a graphene film 13 on a growth substrate 11;

S17, locating an adhesive layer 15 on the surface of the graphene film 13 away from the growth substrate 11, removing the growth substrate 11, and washing with water or organic solvent;

S18, taking the graphene film 13 and the adhesive layer 15 out of the water or the organic solution by using the substrate 16, and drying, to obtain a first composite structure 17, wherein the first composite structure 17 includes the substrate 16, the graphene film 13, and the adhesive layer 15; the graphene film 13 is located between the adhesive layer 15 and the substrate 16, and the graphene film 13 is in direct contact with the protrusions 164;

S19, removing the adhesive layer 15 to obtain a second composite structure 19, wherein the second composite structure 19 includes the substrate 16 and the graphene film 13, the graphene film 13 is located on the surfaces of the protrusions 164 and the surface of the substrate body 162 between two adjacent protrusions 164; and the graphene film 13 forms a plurality of wrinkles 18 near the protrusions 164, the wrinkles 18 are located on the surface of the substrate body 162 between the adjacent protrusions 164, the wrinkles 18 extend substantially along the Y direction, and the thickness of the graphene film 13 at the wrinkle 18 is greater than the thickness of the graphene film 13 on the surface of the substrate body 162 between adjacent protrusions 164; and S20, etching from the surface of the graphene film 13 away from the substrate 16, to remove the graphene films 13 on the protrusions 164 and the graphene film 13 on the surface of the substrate body 162 between the adjacent protrusions 164 except for the wrinkles 18, thereby obtaining the graphene nanoribbon composite structure 20, wherein the graphene nanoribbon composite structure 20 includes the substrate body 162, the plurality of protrusions 164, and a plurality of graphene nanoribbons 22 parallel to each other; and the plurality of graphene nanoribbons 22 are spaced apart from each other and located on the substrate body 162.

During step S11, the material of the base 10 can be conductive material, semiconducting material or insulating material. The material of the base 10 can be gallium nitride, gallium arsenide, sapphire, aluminum oxide, magnesium oxide, silicon, silicon dioxide, silicon nitride, quartz, glass, or the like. The material of the base 10 can also be flexible material, such as polyethylene terephthalate (PET) or polyimide (PI). Further, the material of the base 10 can also be a doped semiconductor material, such as P-type gallium nitride, N-type gallium nitride, and the like. The size, thickness and shape of the base 10 are not limited and can be selected according to actual needs. In one embodiment, the material of the base 10 is silicon oxide. In another embodiment, the base 10 is a silicon wafer with silicon oxide, the silicon oxide is located on the surface of the silicon wafer, and a thickness of the silicon oxide is about 300 nm.

The material of the mask layer 12 is not limited, and can be ZEP520A, HSQ (hydrogen silsesquioxane), PMMA (Polymethylmethacrylate), PS (Polystyrene), SOG (Silicon on glass), MMA (Methyl methacrylate) or other silicone oligomer materials. The mask layer 12 can be formed by depositing on the surface of the base 10 and then drying, or can be formed by a screen printing method. In one embodiment, the material of the mask layer 12 is PMMA.

The method for defining the plurality of through holes 126 on the mask layer 12 is not limited. In one embodiment, the electron beam exposure is used to form a through hole array. In one embodiment, a diameter of each through hole 126 is about 40 nm, a distance between two adjacent through holes 126 in each column is less than 500 nm, and a distance between two adjacent columns is greater than 500 nm. In the X direction, the distance between two adjacent through holes 126 is greater than 500 nm; in the Y direction, the distance between two adjacent through holes 126 is less than 500 nm. The shape of the through hole 126 is not limited, and can be a circle, a square, a triangle, or the like.

During step S12, the metal layer 14 can be deposited on the second surface 124 of the mask layer 12 by many methods, such as electron beam evaporation, ion beam sputtering, or the like. The metal layer 14 is also located in the through holes 126. The material of the metal layer 14 is a metal that can be removed by an etching solution, and the material of the metal layer 14 can be iron, gold, chromium, copper, or aluminum. The thickness of the metal layer 14 is not limited. In one embodiment, the metal layer 14 is a copper layer with a thickness of about 15 nm.

During step S13, the method for peeling off the mask layer 12 is not limited, such as using tweezers and other tools to peel off the mask layer 12. The mask layer 12 can be removed by dissolving the mask layer 12 in the organic solvent.

During step S14, the metal layer 14 that remains on the base 10 in the step S13 is used as a mask, and the base 10 is dry-etched by reactive ion etching (RIE), so that the plurality of protrusions 164 are formed on the base 10. The metal layer 14 that remains on the base 10 covers the plurality of protrusions 164. In one embodiment, the etching depth is about 15 nm, and the height of the protrusion 164 is about 15 nm.

During step S15, the metal layer 14 that remains on the substrate 10 is removed with the etching solution. The metal layer 14 that remains on the substrate 10 is removed by a wet etching method. The type of the etching solution can be selected according to different materials of the metal layer 14. In one embodiment, the metal layer 14 is a copper layer; the etching solution is sulfuric acid, nitric acid, hydrochloric acid, or a mixture; and the mixture is formed by hydrogen peroxide, hydrochloric acid, and deionized water (the volume ratio of hydrogen peroxide, hydrochloric acid and deionized water is 1:1:50). In one embodiment, the plurality of protrusions 164 are arranged in order, the direction of each row is defined as the X direction, and the direction of each column is defined as the Y direction. The protrusions 164 in each row extend along the X direction, and the protrusions 164 in each column extend along the Y direction. The shape of the protrusion 164 is not limited, and can be a circle, a square, a triangle, or the like. In one embodiment, the protrusion 164 is a cylinder with a diameter of about 40 nm and a height of about 15 nm.

During step S16, the method of growing the graphene film 13 on the growth substrate 11 is not limited. The material of the growth substrate 11 can be copper, and the size of the growth substrate 11 is not limited and can be selected according to actual conditions. In one embodiment, the growth substrate 11 is a copper sheet. In one embodiment, the method of growing the graphene film 13 on the growth substrate 11 includes the following steps:

S161, depositing a catalyst layer on the growth substrate 11; and

S162, placing the growth substrate 11 with the catalyst layer in a chamber, supplying the carbon source gas into the chamber, and heating the growth substrate 11, thereby forming the graphene film 13 on the growth substrate 11.

During step S161, a metal or metal compound material is deposited on the surface of the growth substrate 11 to form the catalyst layer. The metal can be one of gold, silver, copper, iron, cobalt and nickel, or any combination thereof. The metal compound may be one of zinc sulfide, zinc oxide, iron nitrate, iron chloride, copper chloride, or any combination thereof. A method for depositing the catalyst layer on the growth substrate 11 is not limited, such as chemical vapor deposition, physical vapor deposition, vacuum thermal evaporation, magnetron sputtering, plasma enhanced chemical vapor deposition, or printing.

During step S162, the chamber can provide a reaction space for growing the graphene film 13. The chamber can have a sealed cavity. The chamber includes a gas inlet and a gas outlet. The gas inlet is used to input a reaction gas or other resource gas. The gas outlet is connected with an evacuating device. The evacuating device can be used to adjust the pressure in the chamber. Furthermore, the chamber can include a water cooling device to adjust the temperature in the chamber. The chamber can be a quartz tube furnace.

The chamber is evacuated before heating the growth substrate 11. In one embodiment, hydrogen gas can be introduced in the chamber through the gas inlet before heating the growth substrate 11. The hydrogen gas can prevent the growth substrate 11 from oxidizing. The carbon source gas can be at least one of methane, ethane, ethylene, or acetylene. A flow rate of the carbon source gas can be in a range from about 20 standard cubic centimeters per minute (sccm) to about 90 sccm. The chamber is heated to a heating temperature that can be in a range from about 800 degrees Celsius to about 1000 degrees Celsius. The chamber is held at the heating temperature for a constant temperature period for about 10 minutes to about 60 minutes. A ratio between the flow rate of the carbon source gas and the hydrogen gas is in a range from about 45:2 to about 15:2. A pressure in the chamber can be in a range from about $10^{-1}$ Pa to about $10^2$ Pa. In one embodiment, the pressure of the chamber is about 500 mTorr, the temperature of the chamber is about 1000 degrees Celsius, the flow rate of the carbon source gas is about 25 sccm, the carbon gas is methane, and the constant temperature period is about 30 minutes.

During step S17, the material of the adhesive layer 15 is not limited. In one embodiment, the material of the adhesive layer 15 is PMMA (methyl methacrylate). The method for removing the growth substrate 11 is not limited, for example, the growth substrate 11 is removed by chemical etching. The material of the growth substrate 11 is copper, and the etching solution used to remove the growth substrate 11 is sulfuric acid, nitric acid, hydrochloric acid, or a mixture. The mixture is formed by hydrogen peroxide, hydrochloric acid and deionized water (the volume ratio of hydrogen peroxide, hydrochloric acid and deionized water is 1:1:50). In one embodiment, the material of the growth substrate 11 is copper, and the etching solution used to remove the growth substrate 11 is a mixed solution composed of hydrogen peroxide, hydrochloric acid and deionized water (the volume ratio of hydrogen peroxide, hydrochloric acid and deionized water is 1:1:50). After the growth substrate 11 is removed, the water or the organic solvent can be used to remove residual impurities. The water is preferably deionized water. The type of the organic solvent is not limited, such as isopropanol.

During step S18, in the process of taking the graphene film 13 and the adhesive layer 15 out of the water or the organic solution by using the substrate 16, the substrate 16 is in direct contact with the graphene film 13, and the adhesive layer 15 is located on the surface of the graphene film 13 away from the substrate 16. Before drying, the water or organic solvent separates the graphene film 13 from the substrate 16, and the water or the organic solvent is between the graphene film 13 and the substrate 16. As the moisture (water) or the organic solvent evaporates, a vacuum state is gradually formed between the graphene film 13 and the substrate 16, and the graphene film 13 is thus closely attached to the substrate 16. The plurality of protrusions 164 are on the substrate body 162, thus the graphene film 13 cannot be smoothly attached to the substrate body 162, therefore wrinkles 18 are formed near the protrusions 164. After combining the graphene film 13, the adhesive layer 15, and the substrate 16, and before drying, the vacuum state between the grapheme film 13 and the substrate 16 is formed when water or organic solvent between the graphene film 13 and the substrate 16 evaporates; and the plurality of winkles 18 are formed on the grapheme film 13 by the plurality of protrusions 164 protruding from the substrate body 162.

The wrinkles 18 are located on the surface of the substrate body 162 between adjacent protrusions 164 and extend along the Y direction, and the thickness of the graphene film 13 at the wrinkles 18 is greater than the thickness of the graphene film 13 on the surface of the substrate body 162 between adjacent protrusions 164. In one embodiment, there are two layers of graphene film 13 at each wrinkle 18, and one layer of graphene film 13 is formed on the surface of the substrate body 162 between adjacent protrusions 164. In one embodiment, after taking the graphene film 13 and the adhesive layer 15 out of water or organic solution by using the substrate 16, the graphene film 13 and the adhesive layer 15 are naturally dried for 3 hours to 6 hours, and then baked at a temperature of 150 degrees Celsius for 2 minutes.

The distance between two adjacent protrusions 164 in the Y direction is smaller than the distance between two adjacent protrusions 164 in the X direction, so that the plurality of wrinkles 18 are formed in the Y direction and the wrinkles 18 extend along the Y direction. The distance between two adjacent protrusions 164 in the X direction is in a range from about 200 nanometers to about 1 micron, and the distance between two adjacent protrusions 164 in the Y direction is in a range from about 100 nanometers to about 800 nanometers. In one embodiment, the distance between two adjacent protrusions 164 in the X direction is about 1 micron, and the distance between two adjacent protrusions 164 in the Y direction is about 500 nanometers. In one embodiment, the distance between two adjacent protrusions 164 in the X direction is 1 micron, and the distance between two adjacent protrusions 164 in the Y direction is 500 nanometers.

During step S19, the method for removing the adhesive layer 15 is not limited, for example, the adhesive layer 15 is dissolved using the organic solvent. The first composite structure 17 has one more adhesive layer 15 than the second composite structure 19. In one embodiment, the material of the adhesive layer 15 is PMMA, and acetone is used to remove PMMA. In one embodiment, the organic solvent is used to remove the adhesive layer 15, after taking the adhesive layer 15 out of the organic solution, the adhesive layer 15 is annealed. The effect of annealing is to remove residual adhesive layer 15 on the surface of the graphene film 13 during transferring the graphene film 13. In one embodiment, the annealing conditions are as follows: hydrogen and argon are introduced under vacuum, the pressure is about 2 Pa, and annealing is performed at about 400 degrees Celsius for about 2 hours. In one embodiment, the annealing pressure is 2 Pa, and annealing is performed at 400 degrees Celsius for 2 hours. In one embodiment, the wrinkles 18 extend along the Y direction.

During step S20, etching is performed from the surface of the graphene film 13 away from the substrate 16, so that the graphene film 13 located on the protrusions 164 and the graphene film 13 located on the surface of the substrate body 162 between two adjacent protrusions 164, except for the wrinkles 18, are removed. When the graphene film 13 on the surface of the substrate body 162 between the adjacent protrusions 164, rather than the wrinkle 18, is etched, the graphene film 13 at the wrinkle 18 is also etched at the same time. The thickness of the graphene film 13 at the wrinkle 18 is greater than the thickness of the graphene film 13 on the surface of the substrate body 162 between two adjacent protrusions 164. Thus, when the graphene film 13 located on the protrusions 164 and the graphene film 13 located on the surface of the substrate body 162 between two adjacent protrusions 164, except for the wrinkles 18, are completely etched and removed, the graphene still exists at the wrinkles 18, so that graphene nanoribbons 22 are formed at the wrinkles 18. In one embodiment, RIE is used for etching in the step S20, and the etching conditions are: the volume flow of hydrogen is about 50 sccm, the pressure is about 5 Pa, the power is about 5 W (watts), and the etching time is about 50 s (seconds). In one embodiment, the etching conditions of RIE are: the volume flow of hydrogen is 50 sccm, the pressure is 5 Pa, the power is 5 W, and the etching time is 50 s.

Furthermore, the plurality of protrusions 164 may also be removed by etching. The preparation method of the graphene nanoribbon composite structure 20 further includes a step of removing the plurality of protrusions 164 by etching.

In one embodiment, a silicon wafer with 300 nm thick $SiO_2$ layer on the surface of the silicon wafer as the base 10. PMMA electron beam glue is spin-coated on the surface of the $SiO_2$ layer away from the silicon wafer, and the $SiO_2$ layer is in direct contact with PMMA. The thickness of the PMMA is about 80 nm. The electron beam exposure and development are performed. The exposure pattern is an array having a plurality of through holes, and the array is made of the PMMA. The diameter of each through hole is about 40 nm, a distance between two adjacent through holes in each column of the through hole array is about 500 nm, and a distance between two adjacent columns is about 500 nm. Afterwards, electron beam evaporation is used to deposit copper with a thick of about 15 nm, and then PG solution is used to remove the PMMA glue and partial copper is also removed when removing the PMMA glue, to form a copper pillar array having a plurality of copper pillars. The diameter of each copper pillar is about 40 nm, a distance between two adjacent copper pillars in each column is about 500 nm, and a distance between two adjacent columns is about 500 nm. Then, the copper pillar array is used as a mask to etch the base 10, and finally the copper pillars is removed to obtain the substrate 16 with an array structure. The protrusions 164 on the substrate 16 are cylindrical with a diameter of about 40 nm and a height of about 15 nm.

When transferring graphene, PMMA is first spin-coated on a copper foil grown with a single layer of graphene at a rotation speed of 3000 rpm, and then baked on a hot plate at 180 degrees Celsius for 2 minutes to volatilize the solvent. In the process of growing graphene, graphene will grow on two opposite surfaces of the copper foil, and the graphene structure on the back of the copper foil is incomplete and needs to be removed. Therefore, RIE is used to remove the graphene on the back of the copper foil. The etching conditions are: oxygen etching, pressure of about 2 Pa, flow rate of about 40 sccm, power of about 50 W, and etching time of about 30 seconds. Next, the copper foil is put in the etching solution. The etching solution is a mixture of hydrochloric acid, hydrogen peroxide and deionized water, and the volume ratio of hydrogen peroxide, hydrochloric acid and deionized water is 1:1:50. After the copper foil is completely etched, the graphene and PMMA film are cleaned several times with deionized water. Then, the graphene and PMMA film are picked up using the substrate 16 and leave for 6 hours to evaporate the water. Then, the substrate 16 is baked for 2 minutes using the hot plate at 150 degrees Celsius, to obtain a sample. The sample is then put into an acetone solution and soaked for 10 minutes, and then taken out, the sample is cleaned with deionized water, and the water of the surface of the sample is blown off with nitrogen. Finally, the substrate 16 with graphene is put into an annealing furnace for annealing, and the annealing conditions are: the flow rate of $H_2$ is about 100 sccm, the flow rate of Ar is about 100 sccm, and annealing is performed at 400 degrees Celsius for 2 hours, so that the graphene nanoribbon composite structure 20 is formed.

FIG. 2 is an atomic force microscope (AFM) image of the second composite structure 19. It can be seen from FIG. 2 that one wrinkle 18 is formed near each protrusion 164, the wrinkle 18 is located on the surface of the substrate body 162 between two adjacent protrusions 164, the wrinkle 18 extends from one protrusion 164 to the adjacent protrusion 164, and the extending directions of the plurality of wrinkles 18 are substantially parallel to each other. In one embodiment, the extending directions of the plurality of wrinkles 18 are parallel to each other.

Figure 3:
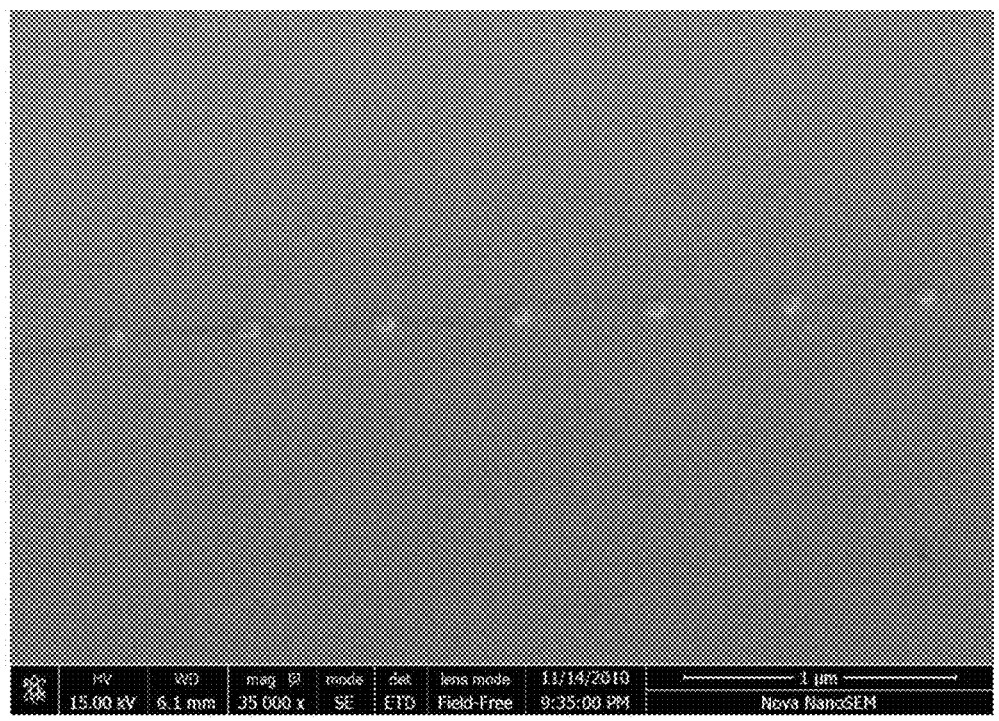
FIG. 3 shows a scanning electron microscope (SEM) image of the graphene nanoribbon composite structure of FIG. 1.
Figure 4:
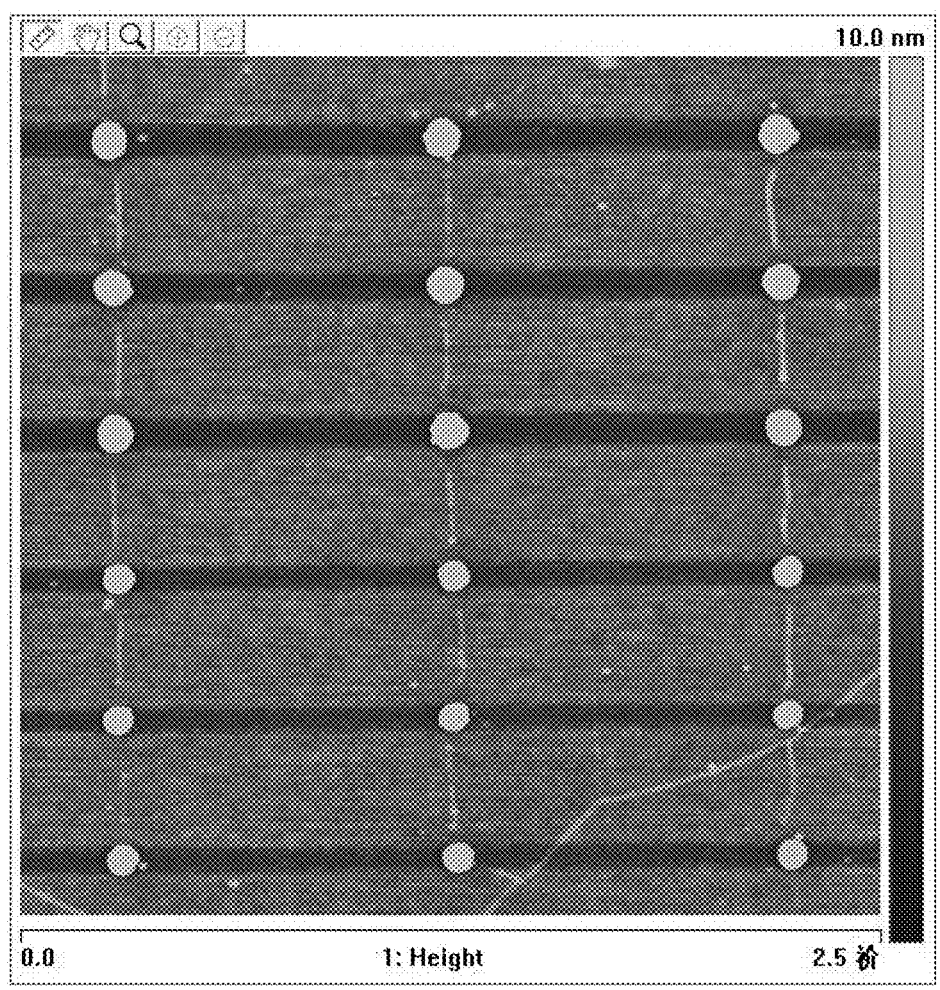
FIG. 4 shows an AFM image of the graphene nanoribbon composite structure of FIG. 1.

FIG. 3 is a scanning electron microscope (SEM) image of the graphene nanoribbon composite structure 20 in the step S20. FIG. 4 is an AFM image of the graphene nanoribbon composite structure 20 in the step S20. In FIG. 4, in the longitudinal direction, the ribbon-like structure between adjacent dots is the graphene nanoribbon 22. The plurality of graphene nanoribbons 22 are arranged at intervals, extend in the same direction and are parallel to each other.

Referring to FIG. 4 and FIG. 5, the graphene nanoribbon composite structure 20 includes the substrate 16 and the plurality of graphene nanoribbons 22 spaced apart from each other, and the plurality of graphene nanoribbons 22 are located on the substrate 16 and extend substantially along the same direction. The substrate 16 includes the substrate body 162 and the plurality of protrusions 164 spaced apart from each other, and the plurality of protrusions 164 are located on the surface of the substrate body 162, and the graphene nanoribbons 22 are in direct contact with the substrate body 162. Each graphene nanoribbon 22 is located between two adjacent protrusions 164 and extends between the two protrusions 164, and the graphene nanoribbons 22 extend from one protrusion 164 to the adjacent protrusion 164. The multiple graphene nanoribbons 22 are parallel to each other, and each graphene nanoribbon 22 has a ribbon structure or a one-dimensional linear structure. Furthermore, when the plurality of protrusions 164 are removed by etching, the graphene nanoribbon composite structure does not include the plurality of protrusions 164, and is composed of the substrate body 162 and the plurality of graphene nanoribbons 22. The material of the substrate 16 is the same as the material of the base 10. In one embodiment, the plurality of graphene nanoribbons 22 extend along the same direction.

Figure 6:
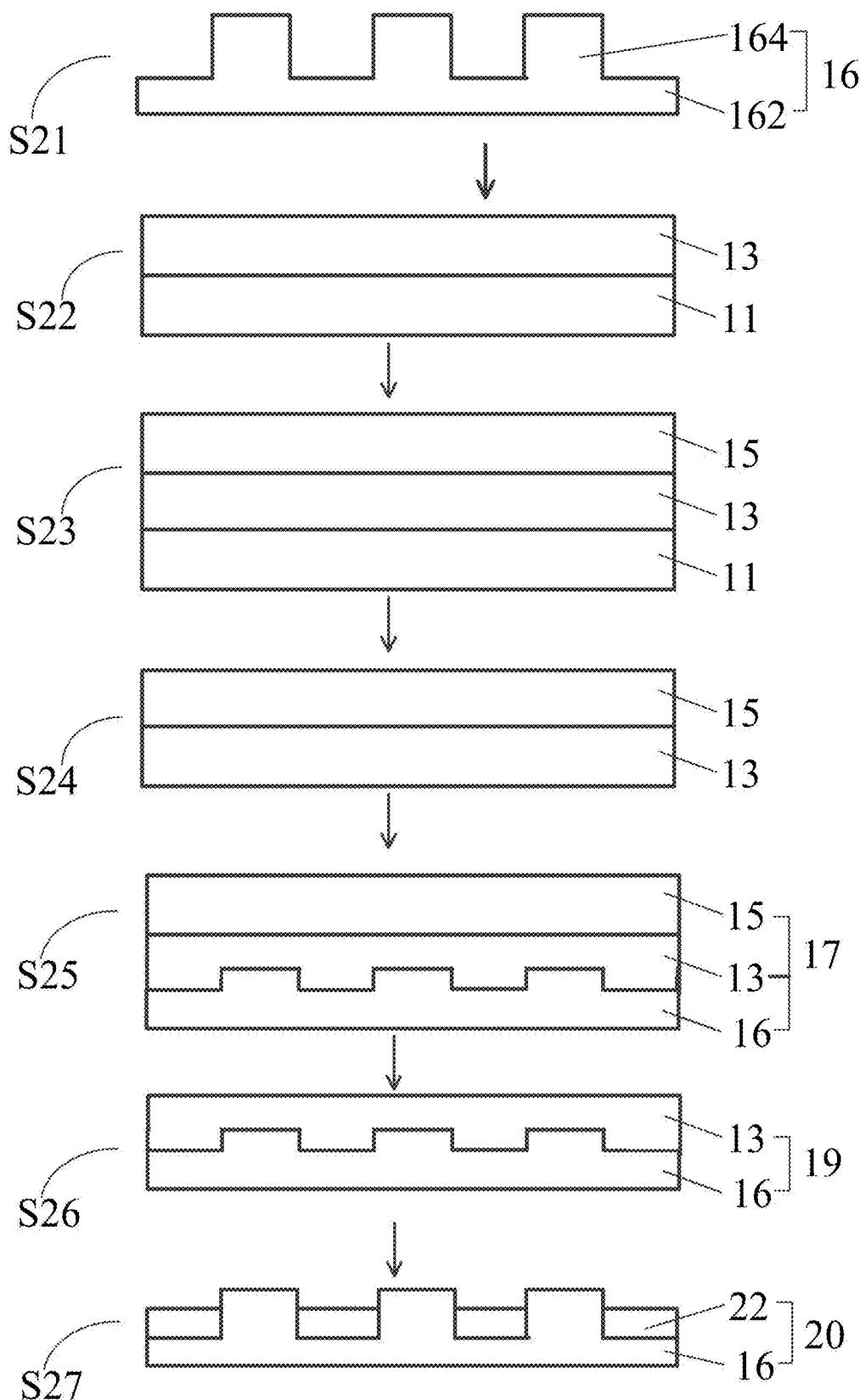
FIG. 6 shows a schematic process flow of a method for making a graphene nanoribbon composite structure in a second embodiment.

Referring to FIG. 2, FIG. 5, and FIG. 6, a method for making the graphene nanoribbon composite structure 20 of the second embodiment, includes the following steps:

S21, providing the substrate 16 including the substrate body 162 and the plurality of protrusions 164 spaced apart from each other, wherein the plurality of protrusions 164 are located on the substrate body 162;

S22, growing the graphene film 13 on the growth substrate 11;

S23, locating the adhesive layer 15 on the surface of the graphene film 13 away from the growth substrate 11;

S24, removing the growth substrate 11, and washing with water or organic solvent;

S25, taking the graphene film 13 and the adhesive layer 15 out of the water or the organic solution by using the substrate 16, and drying, to obtain the first composite structure 17, wherein the first composite structure 17 includes the substrate 16, the graphene film 13, and the adhesive layer 15; the graphene film 13 is located between the adhesive layer 15 and the substrate 16, and the graphene film 13 is in direct contact with the protrusions 164;

S26, removing the adhesive layer 15 to obtain the second composite structure 19, wherein the second composite structure 19 includes the substrate 16 and the graphene film 13, the graphene film 13 is located on the surfaces of the protrusions 164 and the surface of the substrate body 162 between two adjacent protrusions 164; and the graphene film 13 forms the plurality of wrinkles 18 near the protrusions 164, the wrinkles 18 are located on the surface of the substrate body 162 between the adjacent protrusions 164, the wrinkles 18 extend along the Y direction, and the thickness of the graphene film 13 at the wrinkle 18 is greater than the thickness of the graphene film 13 on the surface of the substrate body 162 between adjacent protrusions 164; and S27, etching from the surface of the graphene film 13 away from the substrate 16, to remove the graphene films 13 on the protrusions 164 and the graphene film 13 on the surface of the substrate body 162 between the adjacent protrusions 164, except for the wrinkles 18, thereby obtaining the graphene nanoribbon composite structure 20, wherein the graphene nanoribbon composite structure 20 includes the substrate body 162, the plurality of protrusions 164, and the plurality of graphene nanoribbons 22 parallel to each other; and the plurality of graphene nanoribbons 22 are spaced apart from each other and located on the substrate body 162.

The method for making the graphene nanoribbon composite structure 20 in the second embodiment is similar to the method for making the graphene nanoribbon composite structure 20 in the first embodiment. In the second embodiment, the method for making the substrate 16 is not limited, as long as the substrate 16 includes the substrate body 162 and the plurality of protrusions 164 spaced apart from each other, and the plurality of protrusions 164 are located on the substrate body 162.

Figure 7:
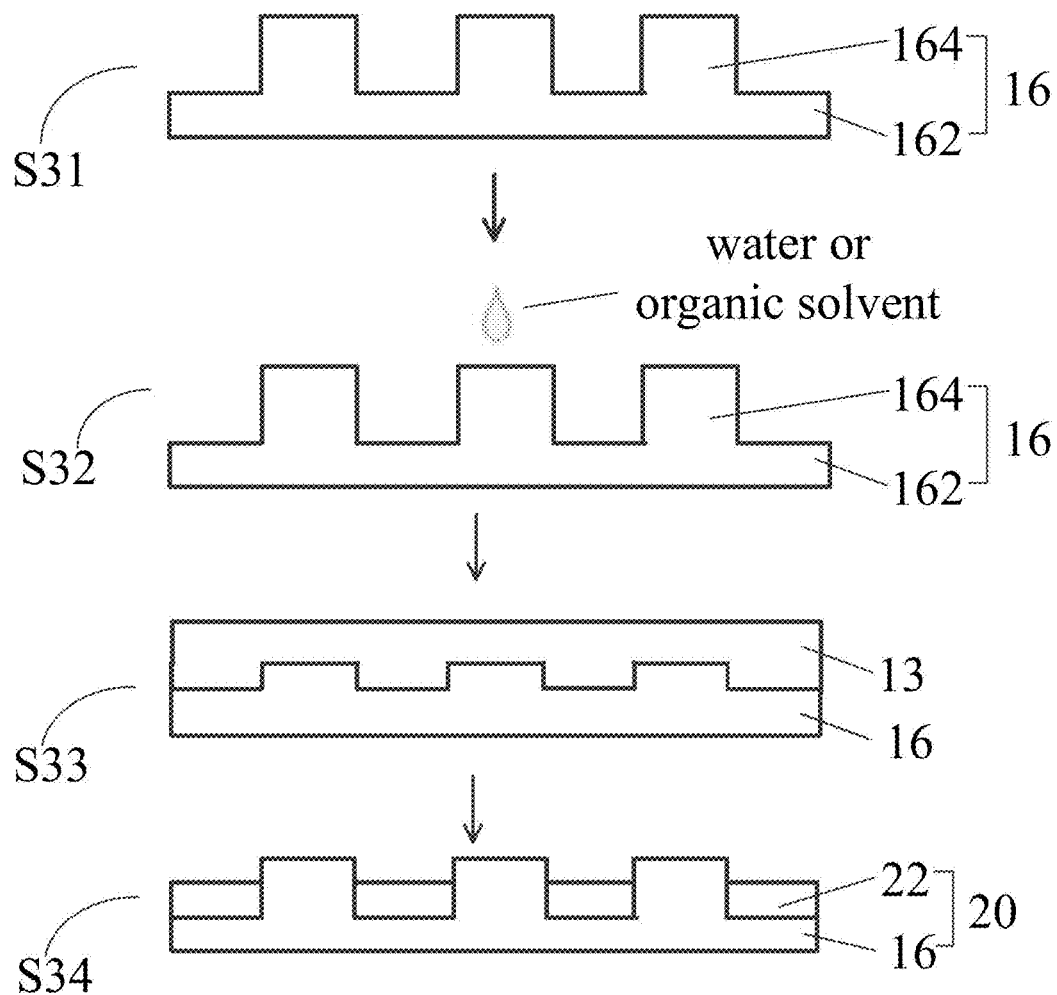
FIG. 7 shows a schematic process flow of a method for making a graphene nanoribbon composite structure in a third embodiment.

Referring to FIG. 2, FIG. 5 and FIG. 7, a method for making the graphene nanoribbon composite structure 20 in a third embodiment, includes the following steps:

S31, providing the substrate 16 including the substrate body 162 and the plurality of protrusions 164 spaced apart from each other, wherein the plurality of protrusions 164 are located on the substrate body 162;

S32, dripping water or an organic solvent on the substrate body 162 between two adjacent protrusions 164 and the plurality of protrusions 164;

S33, locating the graphene film 13 on the surface of the substrate 16 and the protrusions 164 between the graphene film 13 and the substrate body 162, and drying, so that the wrinkle 18 is formed near each protrusion 164, wherein the wrinkles 18 are located on the surface of the substrate body 162 between two adjacent protrusions 164 and extends along the Y direction, and the thickness of the graphene film 13 at the wrinkle 18 is greater than the thickness of the graphene film 13 on the surface of the substrate body 162 between two adjacent protrusions 164; and S34, etching from the surface of the graphene film 13 away from the substrate 16, to remove the graphene films 13 on the protrusions 164 and the graphene film 13 on the surface of the substrate body 162 between the adjacent protrusions 164 except for the wrinkles 18, thereby obtaining the graphene nanoribbon composite structure 20, wherein the graphene nanoribbon composite structure 20 includes the substrate body 162, the plurality of protrusions 164, and the plurality of graphene nanoribbons 22 parallel to each other; and the plurality of graphene nanoribbons 22 are spaced apart from each other and located on the substrate body 162.

During step S32, the method of dripping water or organic solvent on the surface of substrate 16 is not limited. The water or the organic solvent is dripped on the surface of the substrate body 162 between two adjacent protrusions 164 and the surface of the protrusion 164 by a dropper. In this way, during the drying process, as the water or organic solvent evaporates, a vacuum state is gradually formed between the graphene film 13 and the substrate 16, and the graphene film 13 is thus closely attached to the substrate 16. Since the plurality of protrusions 164 are on the substrate body 162, the graphene film 13 cannot be smoothly attached to the substrate body 162, therefore the wrinkles 18 are formed near the protrusions 164. During step S33, before drying, the water or the organic solvent is between the graphene film 13 and the substrate 16.

Furthermore, in the step S33, the graphene film 13 is located on the surface of the substrate 16 by using the adhesive layer 15. The specific method for locating the graphene film 13 on the surface of the substrate 16 by using the adhesive layer 15 is as described in the second embodiment, which will not be repeated here.

The method for making the graphene nanoribbon composite structure 20 in the third embodiment is similar to the method for making the graphene nanoribbon composite structure 20 in the first embodiment. In the third embodiment, the method for making the substrate 16 is not limited, as long as the substrate 16 includes the substrate body 162 and the plurality of protrusions 164 spaced apart from each other, and the plurality of protrusions 164 are located on the substrate body 162; and before locating the graphene film 13 on the surface of the substrate 16, it is necessary to drip the water or organic solvent on at least the protrusions 164.

Figure 8:
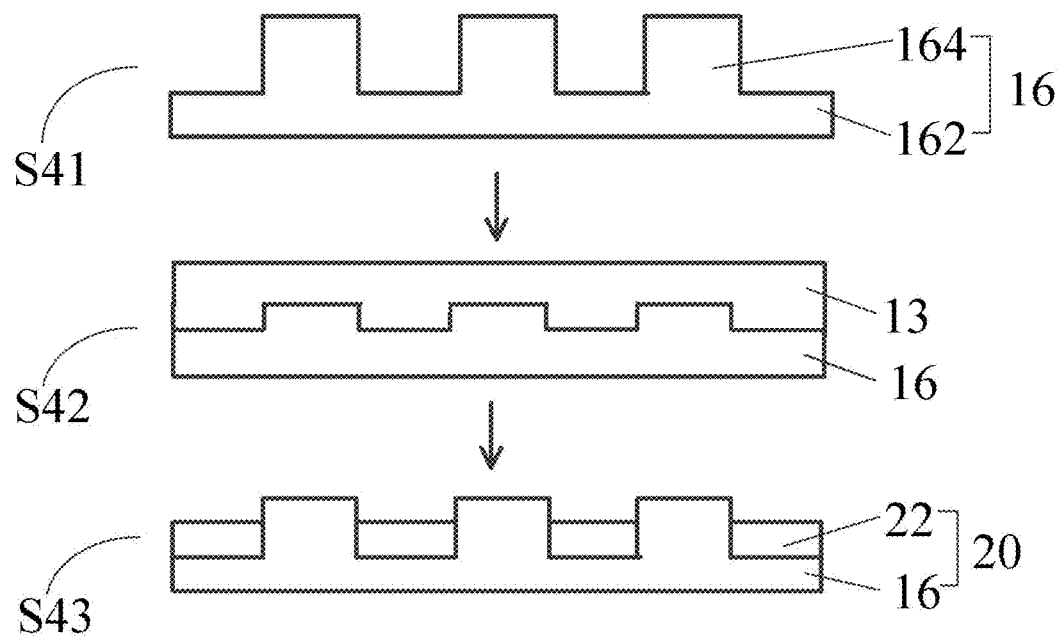
FIG. 8 shows a schematic process flow of a method for making a graphene nanoribbon composite structure in a fourth embodiment.

Referring to FIG. 2, FIG. 5, and FIG. 8, a method for making the graphene nanoribbon composite structure 20 in a fourth embodiment, includes the following steps:

S41, providing the substrate 16 including the substrate body 162 and the plurality of protrusions 164 spaced apart from each other, wherein the plurality of protrusions 164 are located on the substrate body 162;

S42, locating the graphene film 13 on the surface of the substrate 16 and the protrusions 164 between the graphene film 13 and the substrate body 162 in a water or organic solvent environment, so that there is water or organic solvent between the substrate 16 and the graphene film 13; and then drying, so that the wrinkle 18 is formed near each protrusion 164, wherein the wrinkles 18 are located on the surface of the substrate body 162 between two adjacent protrusions 164 and extends along the Y direction, and the thickness of the graphene film 13 at the wrinkle 18 is greater than the thickness of the graphene film 13 on the surface of the substrate body 162 between two adjacent protrusions 164; and S43, etching from the surface of the graphene film 13 away from the substrate 16, to remove the graphene films 13 on the protrusions 164 and the graphene film 13 on the surface of the substrate body 162 between the adjacent protrusions 164 except for the wrinkles 18, thereby obtaining the graphene nanoribbon composite structure 20, wherein the graphene nanoribbon composite structure 20 includes the substrate body 162, the plurality of protrusions 164, and the plurality of graphene nanoribbons 22 parallel to each other; and the plurality of graphene nanoribbons 22 are spaced apart from each other and located on the substrate body 162.

Furthermore, in the step S42, the graphene film 13 is located on the surface of the substrate 16 by using the adhesive layer 15. The specific method for making the graphene film 13 on the surface of the substrate 16 by using the adhesive layer 15 is as described in the second embodiment, and will not be repeated here.

The method for making the graphene nanoribbon composite structure 20 in the fourth embodiment is similar to the method for making the graphene nanoribbon composite structure 20 in the third embodiment. In the fourth embodiment, a graphene film 13 is located on the surface of the substrate 16 in an environment of water or organic solvent, and the protrusions 164 are located between the graphene film 13 and the substrate body 162, there is water or organic solvent between the substrate 16 and the graphene film 13 before drying. Then, as the moisture or organic solvent evaporates, the wrinkles 18 formed by the graphene will be formed near the protrusions 164.

Figure 9:
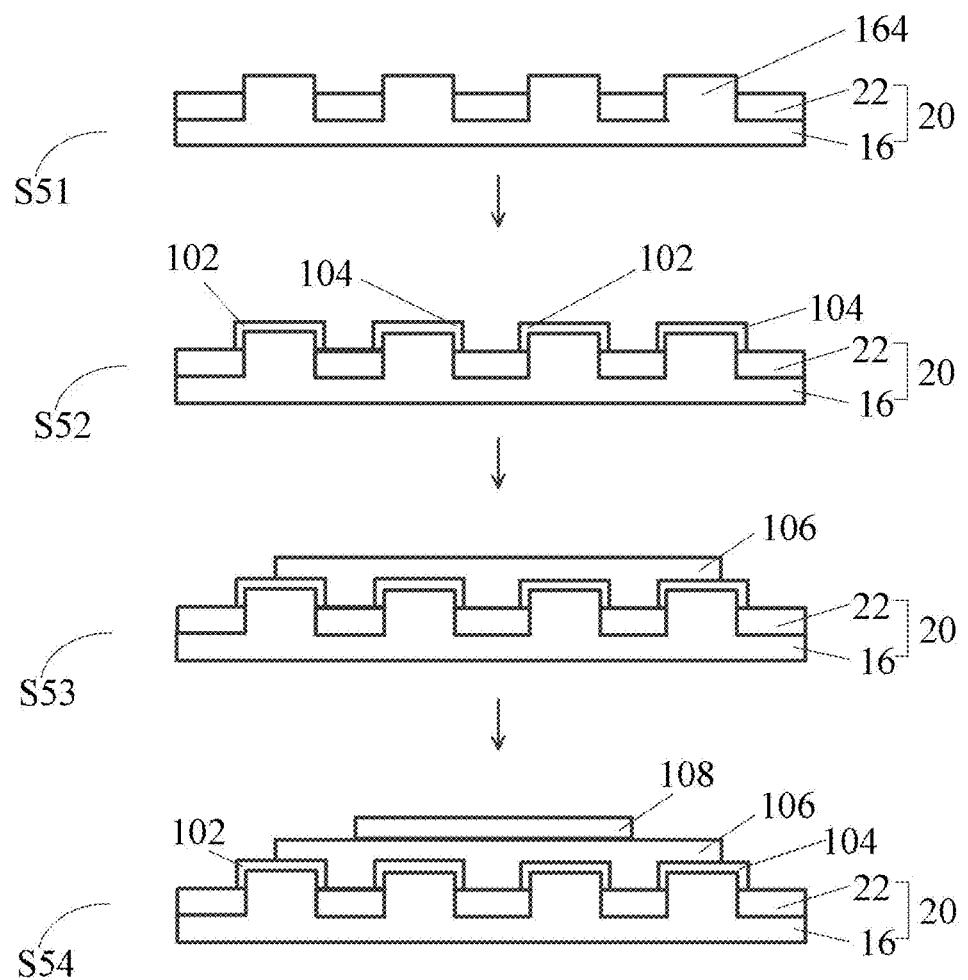
FIG. 9 shows a schematic process flow of a method for making a field effect transistor in a fifth embodiment.
Figure 11:
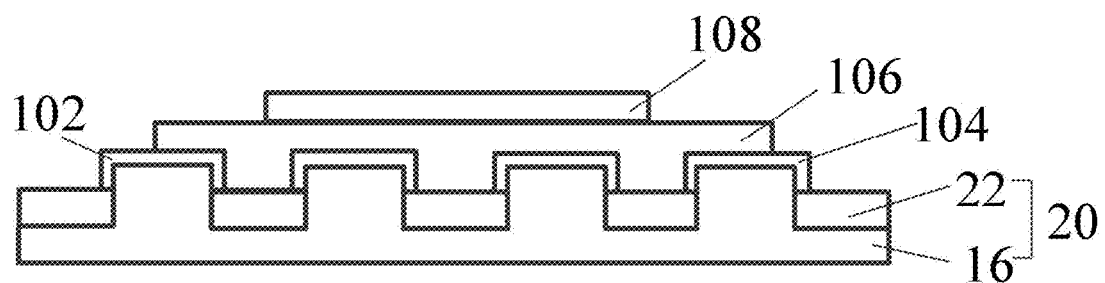
FIG. 11 shows a schematic view of the field effect transistor in the fifth embodiment.

Referring to FIG. 9 and FIG. 11, a method for making a top-gate field effect transistor 100, includes the following steps:

S51, providing the graphene nanoribbon composite structure 20 including the substrate 16 and the plurality of graphene nanoribbons 22 spaced apart from each other, wherein the plurality of graphene nanoribbons 22 are located on the substrate 16 and extend along the same direction, and each graphene nanoribbon 22 includes a first end and a second end opposite to the first end;

S52, forming a source electrode 102 on the first end of the graphene nanoribbon 22, and forming a drain electrode 104 on the second end of the graphene nanoribbon 22, wherein the source electrode 102 and the drain electrode 104 are electrically connected to the graphene nanoribbons 22;

S53, forming an insulating layer 106 on a surface of the graphene nanoribbons 22 away from the substrate 16; and S54, forming a gate 108 on a surface of the insulating layer 106 away from the substrate 16.

During step S51, the method for making the graphene nanoribbon composite structure 20 has been discussed in detail in the first embodiment to the fourth embodiment, and will not be repeated here. The plurality of graphene nanoribbons 22 are semiconductor layers of the field effect transistor 100. The material of the substrate 16 is an insulating material, for example, P-type or N-type silicon with a certain thickness of oxide layer, transparent quartz, or transparent quartz with an oxide layer formed thereon. In addition, the insulating material may also be a resin, such as PET.

Figure 10:
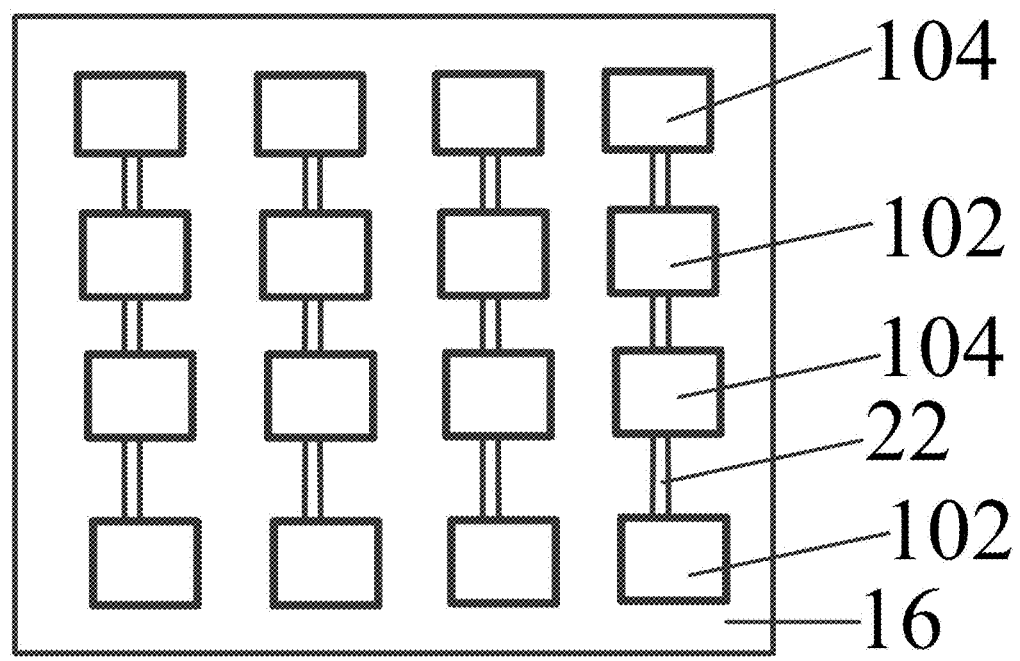
FIG. 10 shows a schematic view of the graphene nanoribbons electrically connected with the source electrodes and the drain electrodes in the fifth embodiment.

During step S52, in one embodiment, the source electrode 102 and the drain electrode 104 respectively cover the protrusion 164 and directly contact with the graphene nanoribbons 22. The first end of the graphene nanoribbons 22 is in direct contact with the source 102, and the second end of the graphene nanoribbons 22 is in direct contact with the drain 104, as shown in FIG. 10.

The materials of the source 102 and the drain 104 have good conductivity. The material of the source electrode 102 and the drain electrode 104 may be metal, alloy, indium tin oxide (ITO), antimony tin oxide (ATO), conductive silver glue, conductive polymer, metallic carbon nanotube film, and so on. According to different types of materials for forming the source 102 and the drain 104, different methods can be used to form the source 102 and the drain 104. When the material of the source electrode 102 and the drain electrode 104 is metal, alloy, ITO or ATO, the source electrode 102 and the drain electrode 104 can be formed by evaporation, sputtering, deposition, masking, or etching. When the material of the source electrode 102 and the drain electrode 104 is conductive silver glue, conductive polymer or carbon nanotube film, the source electrode 102 and the drain electrode 104 can be formed by printing or direct laying the conductive silver glue or the carbon nanotube film. The thickness of the source electrode 102 and the drain electrode 104 is in a rang from about 0.5 nanometers to about 100 microns, and the distance between the source electrode 102 and the drain electrode 104 is in a range from about 10 nanometers to about 800 nanometers. In one embodiment, the material of the source 102 and the drain 104 is metal, the thickness of the source 102 and the drain 104 is about 50 nanometers, and the distance between the source 102 and the drain 104 is about 150 nanometers.

During step S53, the material of the insulating layer 106 may be hard materials such as silicon nitride and silicon oxide, or flexible materials such as benzocyclobutene (BCB), polyester, or acrylic resin. According to different types of materials of the insulating layer 106, different methods can be used to form the insulating layer 106. When the material of the insulating layer 106 is silicon nitride or silicon oxide, the insulating layer 106 can be formed by a deposition method. When the material of the insulating layer 106 is benzocyclobutene (BCB), polyester or acrylic resin, the insulating layer 106 can be formed by printing and coating. The thickness of the insulating layer 106 is in a range from about 0.5 nanometers to about 100 microns. In one embodiment, a deposition method is used to form a silicon nitride insulating layer 106; the silicon nitride insulating layer 106 covers the plurality of graphene nanoribbons 22, the source 102, and the drain 104; and the thickness of the insulating layer 106 is about 50 nanometers.

During step S54, the material of the gate 108 has good conductivity. The material of the gate 108 may be conductive materials such as metal, alloy, ITO, ATO, conductive silver glue, conductive polymer, and carbon nanotube film. The metal or alloy material may be aluminum, copper, tungsten, molybdenum, gold or their alloys. When the material of the gate 108 is metal, alloy, ITO or ATO, the gate 108 can be formed by methods such as evaporation, sputtering, deposition, masking, and etching. When the material of the gate 108 is conductive silver glue, conductive polymer or carbon nanotube film, the gate 108 can be formed by direct adhesion, printing, or coating. The thickness of the gate 108 is in a range from about 0.5 nanometers to about 100 microns. The gate 108 is electrically insulated from the plurality of graphene nanoribbons 22 by the insulating layer 106. In one embodiment, the material of the gate 108 is aluminum, and the thickness of the gate 108 is about 50 nanometers.

Referring to FIG. 11, the field effect transistor 100 includes the graphene nanoribbon composite structure 20, the source 102, the drain 104, the insulating layer 106 and the gate 108. The source electrode 102 is located on the first end of the graphene nanoribbon 22, and the drain electrode 104 is located on the second end of the graphene nanoribbon 22. The source 102 and the drain 104 are electrically connected to the graphene nanoribbons 22. In one embodiment, the source 102 and the drain 104 are in direct contact with the graphene nanoribbons 22. The insulating layer 106 is located between the graphene nanoribbons 22 and the gate 108, so that the graphene nanoribbons 22 and the gate 108 are electrically insulated. The source 102 and the gate 108 are electrically insulated by the insulating layer 106. The drain 104 and the gate 108 are electrically insulated by the insulating layer 106.

Figure 12:
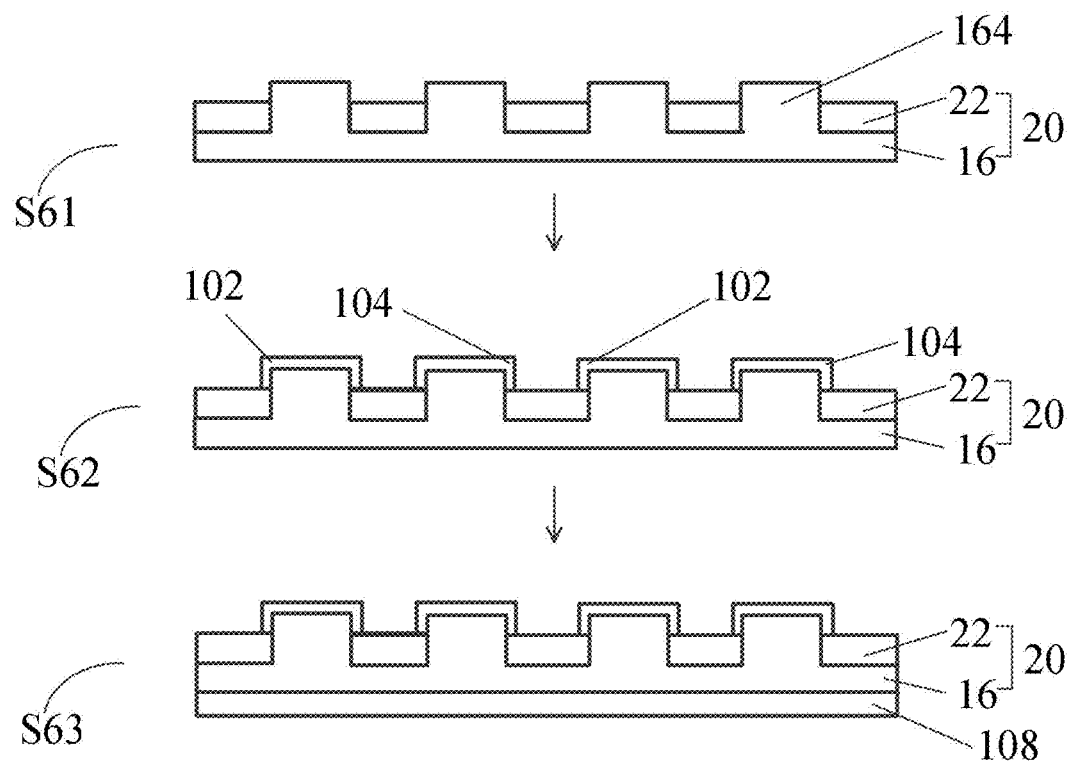
FIG. 12 shows a schematic process flow of a method for making a field effect transistor in a sixth embodiment.
Figure 13:
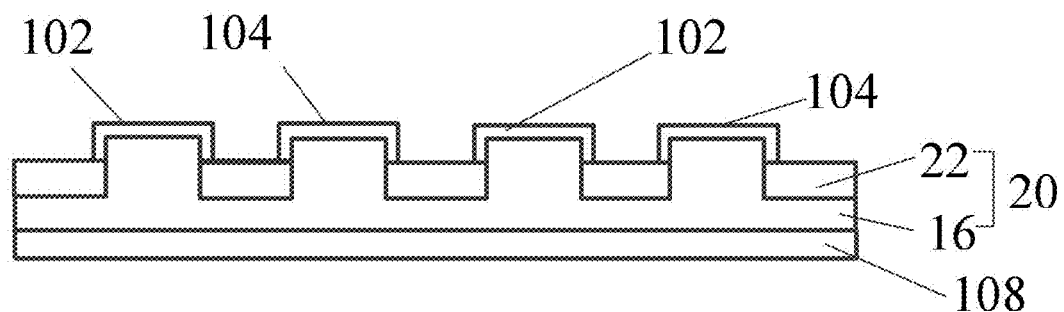
FIG. 13 shows a schematic view of the field effect transistor in the sixth embodiment.

Referring to FIG. 12 and FIG. 13, a method for making a bottom-gate field effect transistor 200, includes the following steps:

S61, providing the graphene nanoribbon composite structure 20 including the substrate 16 and the plurality of graphene nanoribbons 22 spaced apart from each other, wherein the plurality of graphene nanoribbons 22 are located on the substrate 16 and extend along the same direction, and each graphene nanoribbon 22 includes a first end and a second end opposite to the first end;

S62, forming the source electrode 102 on the first end of the graphene nanoribbon 22, and forming the drain electrode 104 on the second end of the graphene nanoribbon 22, wherein the source electrode 102 and the drain electrode 104 are electrically connected to the graphene nanoribbons 22; and S63, forming the gate 108 on a surface of the substrate 16 away from the graphene nanoribbons 22.

During step S61, the material of the substrate 16 is an insulating material. During step S63, the graphene nanoribbons 22 and the gate 108 are respectively located on two opposite surfaces of the substrate 16, and the substrate 16 is equivalent to the insulating layer of the field effect transistor 200. When the substrate 16 is a silicon wafer with a certain thickness of silicon oxide, and the graphene nanoribbons 22 are in direct contact with the silicon oxide, the step S63 can be omitted. In this case, the silicon wafer is equivalent to the gate of the field effect transistor 200 (silicon is conductive), and the silicon oxide is equivalent to the insulating layer of the field effect transistor 200 (silicon oxide is not conductive). In the process of preparing the graphene nanoribbon composite structure 20, the substrate 10 is the silicon wafer with a certain thickness of silicon oxide, and the mask layer 12 is disposed on the silicon oxide, so that the silicon wafer substrate 16 with a certain thickness of silicon oxide can be obtained, and the graphene nanoribbons 22 are in direct contact with silicon oxide.

Referring to FIG. 13, the field effect transistor 200 includes the graphene nanoribbon composite structure 20, the source 102, the drain 104 and the gate 108. The source electrode 102 is located on the first end of the graphene nanoribbon 22, and the drain electrode 104 is located on the second end of the graphene nanoribbon 22. The source 102 and the drain 104 are electrically connected to the graphene nanoribbons 22. The material of the substrate 16 is the insulating material. In one embodiment, the source 102 and the drain 104 are in direct contact with the graphene nanoribbons 22. The gate 108 is located on the surface of the substrate 16 away from the graphene nanoribbon composite structure 20.

When the substrate 16 in the graphene nanoribbon composite structure 20 is the silicon wafer with the silicon oxide, and the graphene nanoribbons 22 are located on the silicon oxide, the gate 108 can be omitted. The silicon wafer can be used as the gate of the field effect transistor 200, and the silicon oxide can be used as the insulating layer of the field effect transistor 200.

The field effect transistor of the sixth embodiment is similar to the field effect transistor of the fifth embodiment, except that: the field effect transistor of the fifth embodiment is a top-gate field effect transistor, and the field effect transistor of the sixth embodiment is a bottom-gate field effect transistor.

Figure 14:
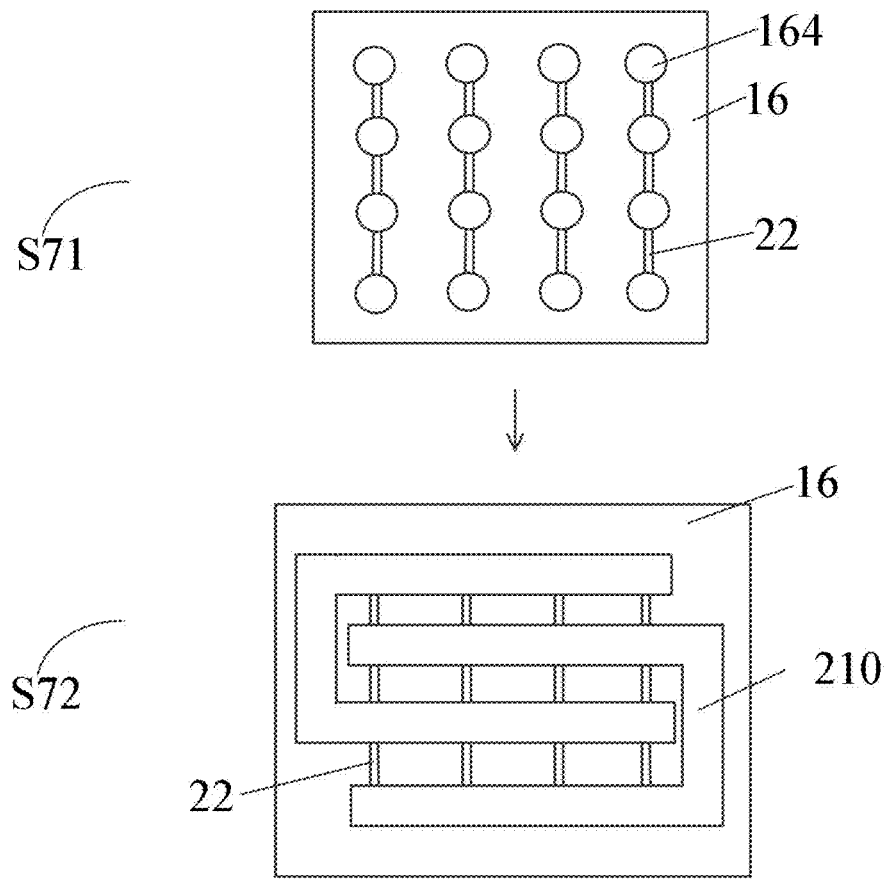
FIG. 14 shows a schematic process flow of a method for making a field effect transistor in a seventh embodiment.
Figure 15:
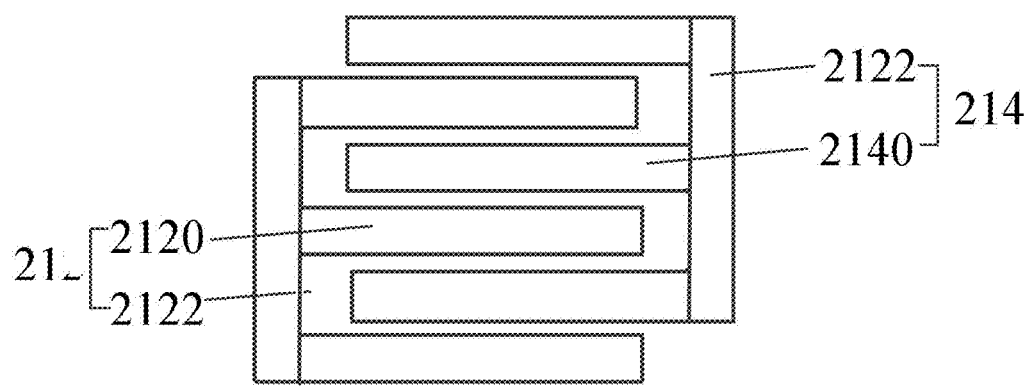
FIG. 15 shows a schematic view of an interdigital electrode in the seventh embodiment.

Referring to FIG. 14 and FIG. 15, a method for making a field effect transistor 300 in a seventh embodiment, includes the following steps:

S71, providing the graphene nanoribbon composite structure 20 including the substrate 16 and the plurality of graphene nanoribbons 22 spaced apart from each other, wherein the plurality of graphene nanoribbons 22 are located on the substrate 16 and extend along the same direction; and S72, locating an interdigital electrode 210 on the surface of the graphene nanoribbon composite structure 20, wherein the interdigital electrode 210 covers the plurality of protrusions 164 and is electrically connected to the graphene nanoribbons 22.

During step S71, the substrate 16 of the graphene nanoribbon composite structure 20 is the silicon wafer with silicon oxide, and the graphene nanoribbons 22 are located on the silicon oxide and directly contact with the silicon oxide.

During step S72, in one embodiment, the interdigital electrode 210 is formed by two comb-teeth electrodes. The interdigital electrode 210 includes a first electrode 212 and a second electrode 214. The first electrode 212 includes a plurality of first sub-electrodes 2120, and the second electrode 214 includes a plurality of second sub-electrodes 2140. The plurality of first sub-electrodes 2120 and the plurality of second sub-electrodes 2140 are spaced apart and alternately arranged on the surface of the graphene nanoribbon composite structure 20. The plurality of first sub-electrodes 2120 and the plurality of second sub-electrodes 2140 cover the plurality of protrusions 164, and electrically connected to the plurality of graphene nanoribbons 22. The plurality of graphene nanoribbons 22 are between the substrate 16 and the interdigital electrode 210. In one embodiment, the plurality of first sub-electrodes 2120 are in direct contact with the plurality of graphene nanoribbons 22, and the plurality of second sub-electrodes 2140 are in direct contact with the plurality of graphene nanoribbons 22. The extending directions of the plurality of first sub-electrodes 2120 are perpendicular to the extending directions of the plurality of graphene nanoribbons 22, and the extending directions of the plurality of second sub-electrodes 2140 are perpendicular to the extending directions of the graphene nanoribbons 22. The plurality of first sub-electrodes 2120 are electrically connected to each other, and the plurality of second sub-electrodes 2140 are electrically connected to each other.

In one embodiment, the plurality of first sub-electrodes 2120 are electrically connected through a connecting portion 2122, and the plurality of second sub-electrodes 2140 are electrically connected through the connecting portion 2122, as shown in FIG. 15. The connecting portion 2122 functions as an electrical connection, and is made of conductive material, such as metal. The connecting portion 2122 may be integrally formed with the plurality of first sub-electrodes 2120, and the connecting portion 2122 may be integrally formed with the plurality of second sub-electrodes 2140, to form the interdigital electrode 210. The first electrode 212, the second electrode 214, the source electrode 102, and the drain electrode 104 are made of the same material.

Figure 16:
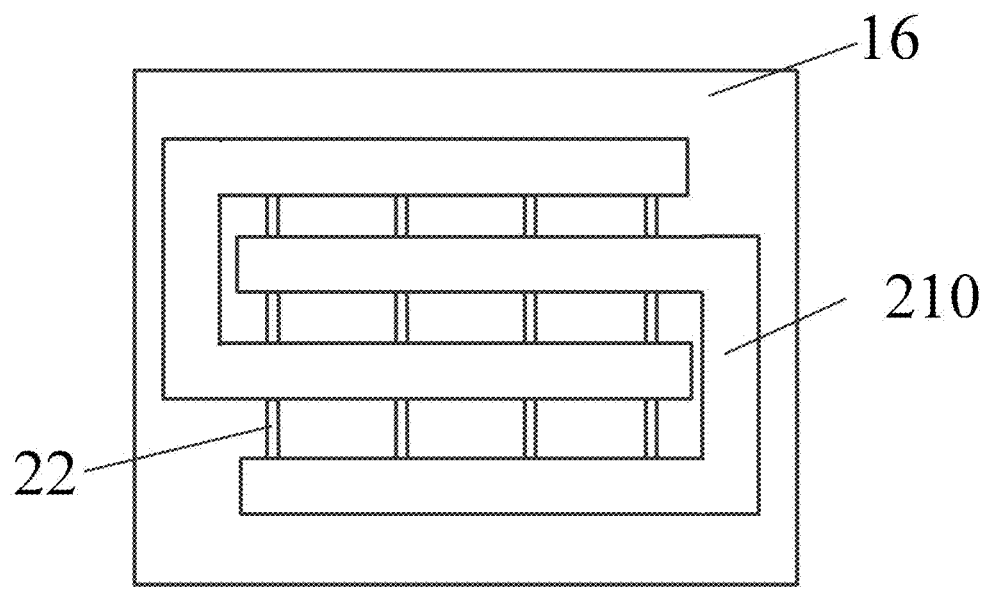
FIG. 16 shows a schematic top view of the field effect transistor in the seventh embodiment.

Referring to FIG. 16, the field effect transistor 300 includes the graphene nanoribbon composite structure 20 and the interdigital electrode 210, and the interdigital electrode 210 is located on the graphene nanoribbon composite structure 20. The interdigital electrode 210 is electrically connected to the graphene nanoribbons 22. In one embodiment, the plurality of first sub-electrodes 2120 and the plurality of second sub-electrodes 2140 are spaced apart and alternately located on the surface of the graphene nanoribbon composite structure 20, and the plurality of first sub-electrodes 2120 and the plurality of second sub-electrodes 2140 cover the plurality of protrusions 164. The plurality of first sub-electrodes 2120 and the plurality of second sub-electrodes 2140 are in direct contact with the plurality of graphene nanoribbons 22. The substrate 16 of the graphene nanoribbon composite structure 20 is the silicon wafer with silicon oxide, and the graphene nanoribbons 22 are located on the silicon oxide and directly contact the silicon oxide. The silicon wafer is used as the gate of the field effect transistor 300, and silicon oxide is used as the insulating layer of the field effect transistor 300.

The field effect transistors 100, 200, and 300 and the methods for making the field effect transistors 100, 200, and 300 have the following advantages: first, in the field effect transistors 100, 200, and 300, the semiconductor layer is the plurality of graphene nanoribbons 22, before combining the graphene film 13 and the substrate 16, water or organic solvent is located on the substrate 16, so that the plurality of wrinkles 18 is formed near the protrusions 164 when combining the graphene film 13 and the substrate 16; and the plurality of graphene nanoribbons 22 is obtained by further etching the graphene film 13; second, the field effect transistors 100, 200, and 300 can be prepared in a large area, and the cost and energy consumption are low.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making a field effect transistor, comprising:
providing a graphene nanoribbon composite structure comprising a substrate and a plurality of graphene nanoribbons spaced apart from each other, wherein the plurality of graphene nanoribbons are located on the substrate and extend substantially along a same direction, the substrate comprises a plurality of protrusions are spaced apart from each other, each of the plurality of graphene nanoribbons is located between adjacent two of the plurality of protrusions and extends from one protrusion to adjacent protrusion, there is a protrusion between adjacent two of the plurality of graphene nanoribbons, and each of the plurality of graphene nanoribbons comprises a first end and a second end opposite to the first end; a method for making the graphene nanoribbon composite structure comprising:
providing the substrate comprising the plurality of protrusions spaced apart from each other;
growing a graphene film on a growth substrate;
placing an adhesive layer on a surface of the graphene film away from the growth substrate;
removing the growth substrate, and cleaning with water or an organic solvent;
combining the graphene film, the adhesive layer, and the substrate; and drying, so that a plurality of wrinkles are formed near the plurality of protrusions, to obtain a first composite structure; wherein the first composite structure comprises the substrate, the graphene film, and the adhesive layer; and the graphene film is between the adhesive layer and the sub state;
removing the adhesive layer to obtain a second composite structure comprising the substrate and the graphene film, wherein the graphene film is located on the substrate; and
etching the graphene film except for the plurality of wrinkles;
forming a source electrode on the first end, and forming a drain electrode on the second end, wherein the source electrode and the drain electrode are electrically connected to the plurality of graphene nanoribbons;
forming an insulating layer on the plurality of graphene nanoribbons, wherein the plurality of graphene nanoribbons are between the insulating layer and the substrate; and
forming a gate on a surface of the insulating layer away from the substrate.

2. The method of claim 1, wherein the substrate comprises a substrate body and the plurality of protrusions, and the plurality of wrinkles are located on the substrate body between two adjacent protrusions.

3. The method of claim 1, wherein a method for making the substrate comprising:
placing a mask layer on a base, wherein the mask layer has a first surface and a second surface opposite to the first surface, the first surface is in direct contact with the base, the mask layer defines a plurality of through holes spaced apart from each other;

depositing a metal on the second surface, wherein the plurality of through holes are filled with the metal;

removing the mask, wherein the metal on the second surface is removed while removing the mask, and the metal in each of the plurality of through holes is still located on the base;

etching the base; and removing the metal on the base.

4. The method of claim 3, wherein the plurality of through holes extend from the first surface to the second surface.

5. The method of claim 3, wherein a material of the metal is iron, gold, chromium, copper, or aluminum.

6. The method of claim 1, wherein the combining the graphene film, the adhesive layer, and the substrate comprises taking the graphene film and the adhesive layer out of the water or the organic solution by using the substrate.

7. The method of claim 1, wherein the plurality of graphene nanoribbons are substantially parallel to each other.

8. The method of claim 1, wherein after combining the graphene film, the adhesive layer, and the substrate, and before drying, a vacuum state between the grapheme film and the substrate is formed when water or organic solvent between the graphene film and the substrate evaporates; and a plurality of winkles are formed on the grapheme film by the plurality of protrusions protruding from the substrate body.

9. The method of claim 1, wherein the source electrode covers one of the plurality of protrusions and is in direct contact with one of plurality of graphene nanoribbons; and the drain electrode covers one of the plurality of protrusions and is in direct contact with one of plurality of graphene nanoribbons.

10. A method for making a field effect transistor, comprising:

providing a graphene nanoribbon composite structure comprising a substrate and a plurality of graphene nanoribbons spaced apart from each other, wherein the plurality of graphene nanoribbons are located on the substrate and extend substantially along a same direction, and each of the plurality of graphene nanoribbons comprises a first end and a second end opposite to the first end; a method for making the graphene nanoribbon composite structure comprising:

providing the substrate comprising a plurality of protrusions spaced apart from each other;

growing a graphene film on a growth substrate;

placing an adhesive layer on a surface of the graphene film away from the growth substrate;

removing the growth substrate, and cleaning with water or an organic solvent;

combining the graphene film, the adhesive layer, and the substrate; and drying, so that a plurality of wrinkles are formed near the plurality of protrusions, to obtain a first composite structure; wherein the first composite structure comprises the substrate, the graphene film, and the adhesive layer; and the graphene film is between the adhesive layer and the substrate;

removing the adhesive layer to obtain a second composite structure comprising the substrate and the graphene film, wherein the graphene film is located on the substrate; and etching the graphene film except for the plurality of wrinkles;

forming a source electrode on each first end, and forming a drain electrode on each second end, wherein the source electrode and the drain electrode are electrically connected to each of the plurality of graphene nanoribbons;

forming an insulating layer on the plurality of graphene nanoribbons, wherein the plurality of graphene nanoribbons are between the insulating layer and the substrate; and forming a gate on a surface of the insulating layer away from the substrate.

11. The method of claim 10, wherein the substrate comprises a plurality of protrusions are spaced apart from each other, each of the plurality of graphene nanoribbons is located between adjacent two of the plurality of protrusions, and there is a protrusion between adjacent two of the plurality of graphene nanoribbons.

12. The method of claim 11, wherein the source electrode covers one of the plurality of protrusions and is in direct contact with each of plurality of graphene nanoribbons; and the drain electrode covers one of the plurality of protrusions and is in direct contact with each of plurality of graphene nanoribbons.

* * * * *